United States Patent
Chi et al.

(10) Patent No.: US 7,442,561 B2
(45) Date of Patent: Oct. 28, 2008

(54) METHOD OF PIPING DEFECT DETECTION

(75) Inventors: Ju-Hsin Chi, Taichung County (TW); Kun-Jung Wu, Taoyuan County (TW); Pin-Yuan Yu, Hsinchu (TW); Yu-Chi Lin, Taipei (TW); Yung-Chih Lin, Hsinchu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 536 days.

(21) Appl. No.: 11/207,895

(22) Filed: Aug. 22, 2005

(65) Prior Publication Data

US 2006/0183256 A1    Aug. 17, 2006

(30) Foreign Application Priority Data

Feb. 14, 2005   (TW) ............................... 94104171 A

(51) Int. Cl.
     *H01L 21/00*   (2006.01)
(52) U.S. Cl. ............................... 438/17; 438/14; 438/16
(58) Field of Classification Search ................... 438/17, 438/16, 14
     See application file for complete search history.

(56) References Cited

U.S. PATENT DOCUMENTS

| | | | | |
|---|---|---|---|---|
| 6,500,721 | B1 * | 12/2002 | Kuo | 438/367 |
| 6,825,119 | B1 * | 11/2004 | Lin | 438/692 |
| 6,855,568 | B2 * | 2/2005 | Weiner et al. | 438/17 |
| 7,132,354 | B2 * | 11/2006 | Lin et al. | 438/586 |
| 7,157,358 | B2 * | 1/2007 | Hall et al. | 438/583 |
| 7,211,516 | B2 * | 5/2007 | Chen et al. | 438/682 |
| 7,338,888 | B2 * | 3/2008 | Lu et al. | 438/583 |
| 2005/0215037 | A1 * | 9/2005 | Lu et al. | 438/583 |
| 2005/0215038 | A1 * | 9/2005 | Hall et al. | 438/583 |
| 2006/0024882 | A1 * | 2/2006 | Lu et al. | 438/239 |
| 2006/0134812 | A1 * | 6/2006 | Lin et al. | 438/14 |
| 2006/0183256 | A1 * | 8/2006 | Chi et al. | 438/14 |
| 2006/0223295 | A1 * | 10/2006 | Chen et al. | 438/592 |
| 2007/0001233 | A1 * | 1/2007 | Schwan et al. | 257/369 |
| 2007/0054481 | A1 * | 3/2007 | Chen et al. | 438/581 |
| 2007/0105368 | A1 * | 5/2007 | Tsui et al. | 438/624 |
| 2007/0141840 | A1 * | 6/2007 | Chen et al. | 438/682 |
| 2007/0167009 | A1 * | 7/2007 | Chen et al. | 438/682 |
| 2007/0281472 | A1 * | 12/2007 | Press et al. | 438/664 |

FOREIGN PATENT DOCUMENTS

TW            589723         6/2004

* cited by examiner

*Primary Examiner*—Laura M Menz
(74) *Attorney, Agent, or Firm*—Muncy, Geissler, Olds & Lowe, PLLC

(57) ABSTRACT

A method of piping defect detection is provided. A semiconductor substrate having an active region and an isolation region is provided, a plurality of semiconductor elements are formed on the semiconductor substrate, a dielectric layer is deposited on the semiconductor substrate and the semiconductor elements, and first and second contact plugs are formed in the dielectric layer to connect the active region and the isolation region respectively. The first contact plug and the second contact plug are illuminated by an electron beam, accumulating charge on the second contact plug, and piping defects are detected between the first contact plug and the second contact plug according to brightness contrast between the first contact plug and the second contact plug.

8 Claims, 4 Drawing Sheets

METHOD OF PIPING DEFECT DETECTION

BACKGROUND

The present invention relates to a method of piping defect detection in semiconductor fabrication, and more particularly, to a method of piping defect detection in inter-layer dielectric layers.

In semiconductor fabrication, after electrical elements, such as metal oxide semiconductor (MOS) transistors, are formed in a substrate, a dielectric layer, referred to as an inter-layer dielectric layer, is typically formed thereon for isolation and protection of electrical elements beneath. Normally, a plurality of contact holes is formed in the inter-layer dielectric layer to fill a conductive layer, used to form a contact plug in each contact hole. Thus, the electrical elements connect with other external electrical elements, such as a conductive wire, through the contact plugs. Data signals are thus transferred to the electrical elements, such as a source or a drain of a transistor, through the conductive wire and the contact plugs to control the operation of each electrical element.

FIGS. 1A to 1B show conventional fabrication of a contact plug in a DRAM. As shown in FIG. 1A, a wafer 10 comprises a substrate 12, preferably silicon, on which an isolation structure 13 is formed to define an active area by, for example, local oxidation of silicon (LOCOS) or shallow trench isolation (STI). Transistors 14, 16, 18, and 20 are disposed on the surface of the substrate 12. The transistor 14 uses the polysilicon layer as the gate with the transistor 18 and the doped region as the source with the transistor 16. In the same manner, the transistor 20 shares a polysilicon layer with the transistor 16 and a source with transistor 18.

As shown in FIG. 1B, a dielectric layer 22, such as a borophospho-tetra-ehtyl-ortho silicate (BPTEOS) layer, is deposited on the wafer 10 by film deposition such as low pressure chemical vapor deposition (LPCVD), atmospheric pressure chemical vapor deposition (APCVD), or plasma enhanced chemical vapor deposition (PECVD). Photo-etching forms a plurality of contact holes in the dielectric layer 22, and a conductive layer (not shown), such as a polysilicon layer, is deposited on the dielectric layer 22 to fill the contact holes to form contact plugs 26, 28, 30, 32, 34, and 36.

With reduced process size and increased integration, a plurality of voids 24 with piping shapes easily form among gates due to the low filling capability of the dielectric layer 22, connecting contact holes. Although rapid heat treatment is often used to reflow to reduce voids 24 in the dielectric layer 22, such voids cannot be avoided completely. Some contact plugs thus connect or short with each other, such as contact plugs 34 and 36 shown in FIG. 1B, causing the transistors 14, 16, 18 and 20 do malfunction, referred to as piping defects.

Normally electrical elements exhibiting these defects may not be identified for several months since the processes are at the front end of semiconductor fabrication, such that failed electrical elements can only be detected after production. In addition, conventional methods for piping defect detection are incomplete detection with online monitoring due to long treatment time and detection time. Manufacturers normally sample products online, but this does not completely solve the problems and creates higher costs.

Consequently, a simple, effective, online method of piping defect detection is needed.

A method of piping defect detection is disclosed in U.S. Pat. No. 6,825,119, in which a polysilicon layer formed on the dielectric layer electrically connects to electrical elements through contact holes in the dielectric layer. Chemical mechanical polishing removes the polysilicon layer and parts of the dielectric layer. Wet etching removes parts of the dielectric layer. The sample is inspected under UV to detect piping defects according to brightness contrast between the polysilicon layer and the silicon oxide layer. Real-time automatic defect classification (ADC) can be applied to detect the online samples, such that yield and reliability are improved.

SUMMARY

The present invention relates to a method of piping defect detection in semiconductor fabrication, and more particularly, to a method of piping defect detection in inter-layer dielectric layer.

The method according to the present invention provides non-destructive, online monitoring, shortened inspection time, complete detection, and reduced time and costs in semiconductor fabrication.

A semiconductor substrate having an active region and an isolation region is provided, a plurality of semiconductor elements are formed on the semiconductor substrate, a dielectric layer is deposited on the semiconductor substrate and the semiconductor elements, and first and second contact plugs are formed in the dielectric layer to connect the active region and the isolation region respectively. The first contact plug and the second contact plug are illuminated by electron beam, accumulating charges on the second contact plug, and determining if piping defects exist between the first contact plug and the second contact plug according to brightness contrast between the first contact plug and the second contact plug.

Reference will now be made in detail to the preferred embodiment of the present invention, illustrated in the accompanying drawings.

DETAILED DESCRIPTION

Scanning electron microscope (SEM) is generally used to measure the line width of elements in semiconductor fabrication. SEM can also be used to observe defects in a product surface. Piping defects in dielectric layer in the present invention are detected by SEM.

Figure 1A:
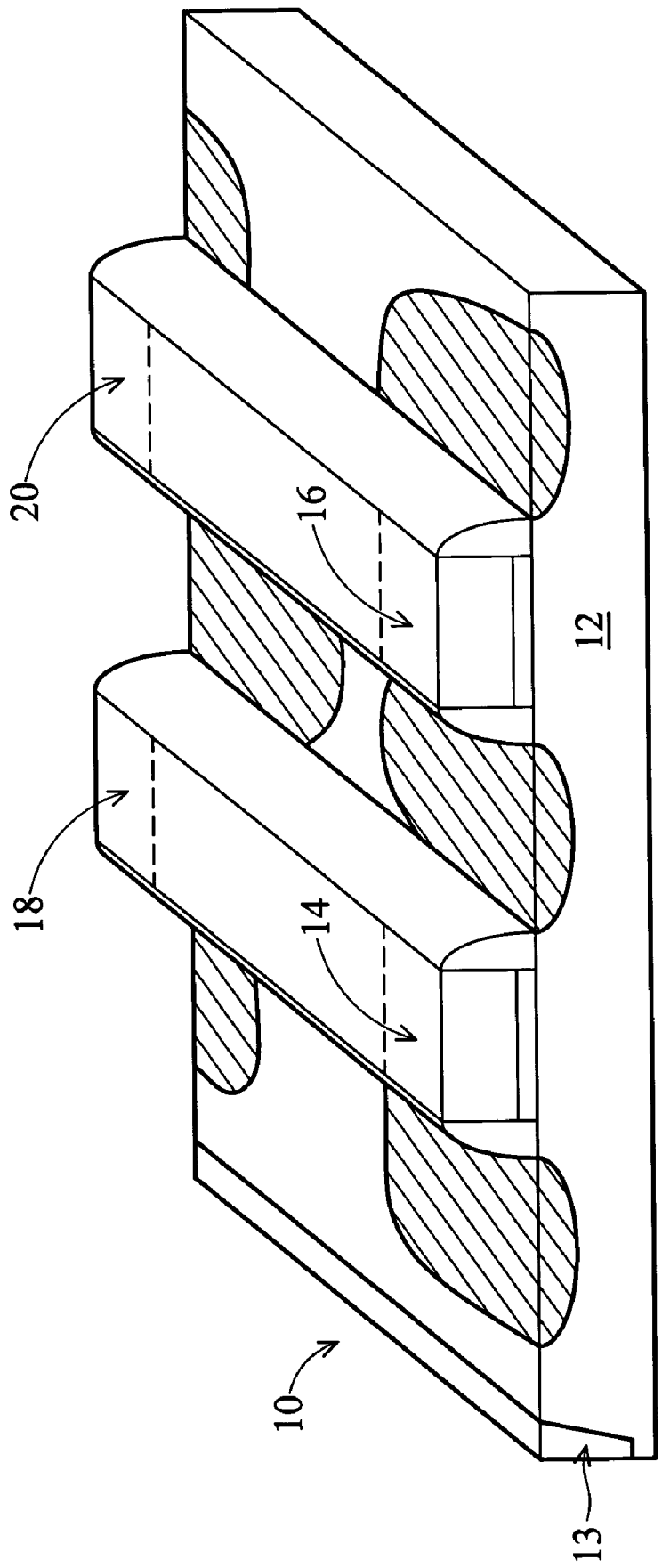
FIGS. 1A to 1B are schematic diagrams of conventional fabrication of contact plugs in a DRAM.
Figure 1B:
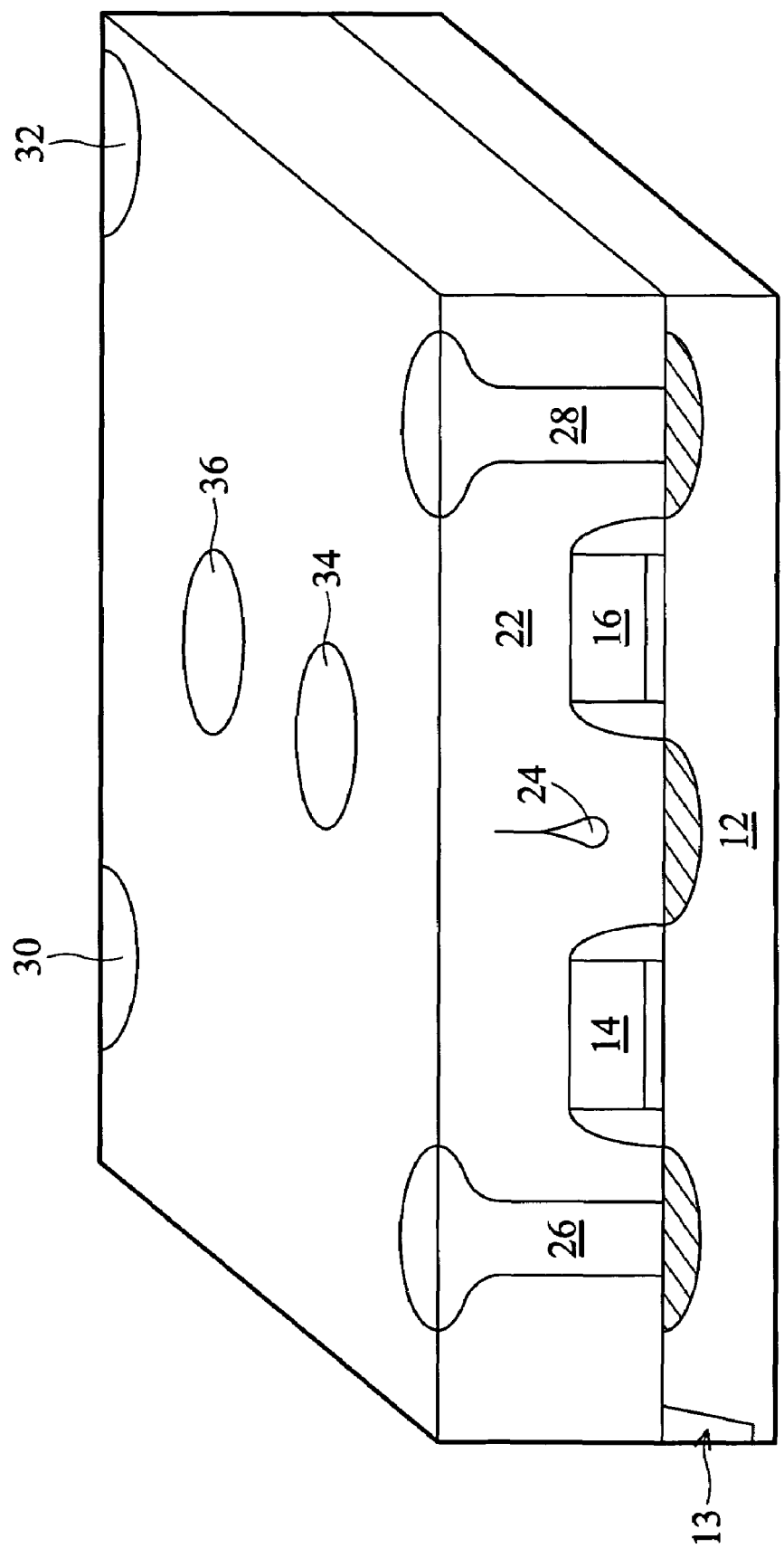
Figure 2A:
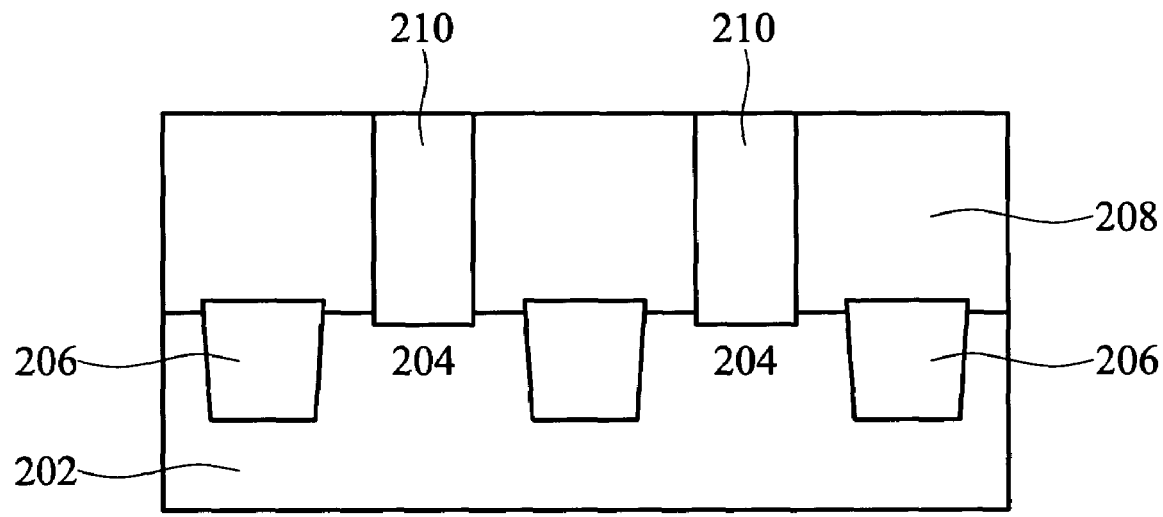
FIGS. 2A to 2B are schematic diagrams of a phenomenon explanation observed by scanning electron microscope.
Figure 2B:
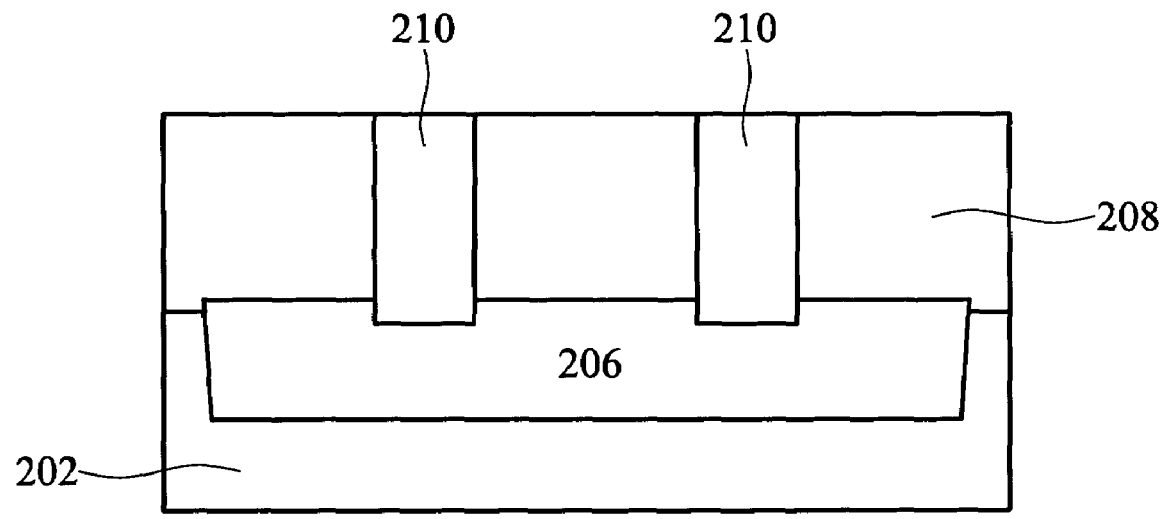

FIGS. 2A to 2B are schematic diagrams of a phenomenon explanation observed by SEM according to the present invention. FIG. 2A illustrates a conventional contact plug structure. A semiconductor substrate 202, preferably of silicon, comprises an active region 204 and an isolation region 206 therein. The active region 204 may be a doped well, and isolation region 206 can be but is not limited to a local oxidation of silicon (LOCOS) structure or a shallow trench isolation (STI) structure. As shown in FIG. 2A, an inter-layer dielectric layer 208 and contact plugs 210 are formed by conventional deposition, lithography, and etching steps. The contact plugs 210, preferably of polysilicon, connect to the active region 204 in the semiconductor substrate 202.

Symbols in FIG. 2B are identical to those of FIG. 2A, wherein like numerals denote like structures throughout the figures. Polysilicon contact plugs 210 connected to isolation region 206 are the main difference between FIG. 2B and FIG. 2A.

Referring to FIG. 2B, when the element is illuminated by an electron beam, electrons cannot be discharged from the substrate 202 due to connection between polysilicon contact plugs 210 and isolation region 206. The electron beam does not penetrate polysilicon contact plugs 210 when electron charge is accumulated therein, such that the number of second electrons detected from the contact plugs 210 is decreased, and images of the contact plugs 210 inspected from FIG. 2B are darker than those from FIG. 2A.

Figure 3A:
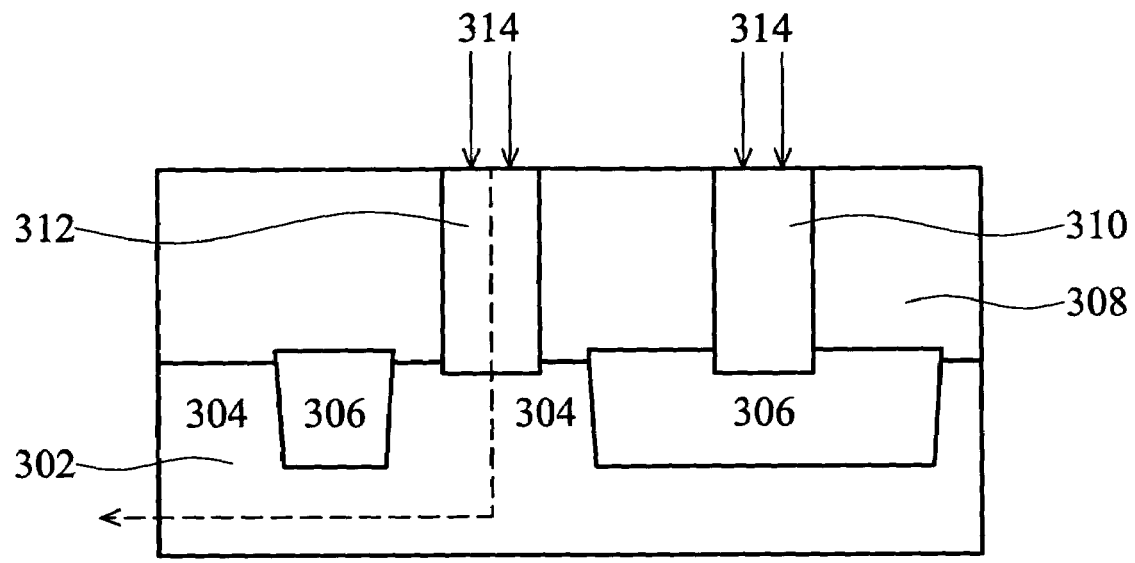
FIGS. 3A to 3B are schematic diagrams of an embodiment of piping defect detection according to the present invention.
Figure 3B:
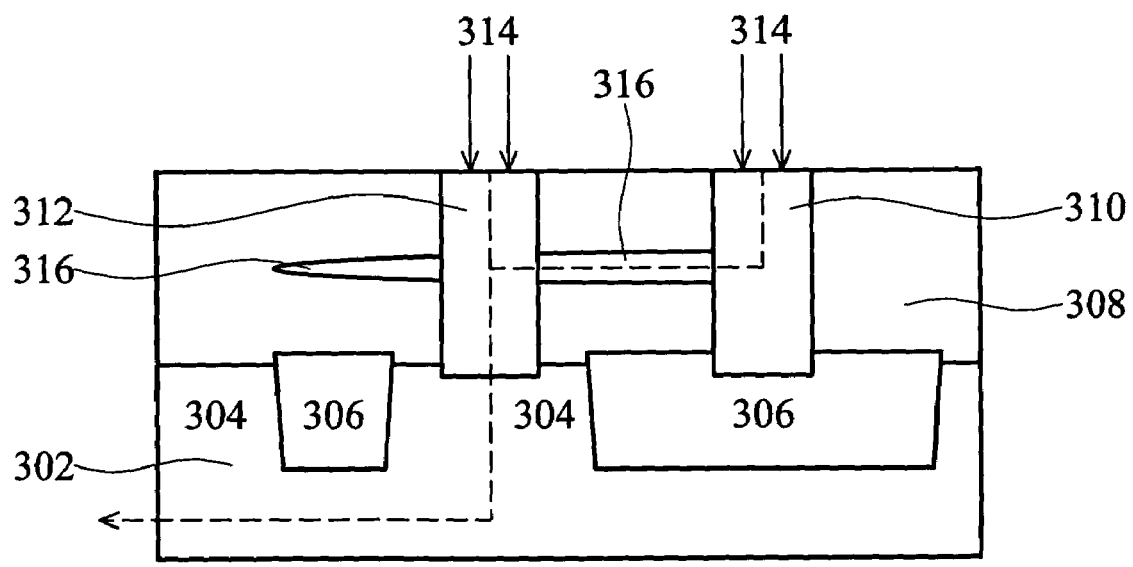

FIG. 3A to 3B illustrates one embodiment of the present invention. For simplicity, like symbols denote like structures throughout the FIGS. 3A to 3B. A structure as shown in FIG. 3A is formed on a scribe line or on an element of a chip during contact plug fabrication. A semiconductor substrate 302, preferably of silicon, is provided, followed by formation of an active region 304 and isolation region 306 therein. The isolation region 306 may be a local oxidation of silicon (LOCOS) structure or a shallow trench isolation (STI) structure. Silicon oxide dielectric layer is formed on the silicon substrate surface. A conductive layer, such as a polysilicon layer, is then blanketly deposited on the substrate. Lithography or etching well-known in the art is performed on the silicon oxide dielectric layer and polysilicon layer to form a gate dielectric layer and a gate electrode of a metal-oxide-semiconductor field-effect transistor (MOSFET).

An ion-doped region is formed on the active region 304 of a semiconductor substrate 302 by ion implantation and an inter-layer dielectric layer 308 is deposited by well-known methods such as low pressure chemical vapor deposition (LPCVD), atomic pressure chemical vapor deposition (APCVD), or plasma-enhanced chemical vapor deposition (PECVD).

A contact hole is formed by well-known methods of lithography and etching, connecting active region 302 and isolation region 304 of the semiconductor substrate 302. A conductive layer, such as a polysilicon layer, is deposited to fill the contact hole and cover the inter-layer dielectric layer 308. Chemical mechanical polishing (CMP) or etching removes the polysilicon layer above the inter-layer dielectric layer 308, and the polysilicon layer inside the contact hole remains to form a first contact plug 312 and a second contact plug 310, respectively connected to the active region 304 and the isolation region 306 of the substrate 302.

FIG. 3A shows the regular structures of the polysilicon contact plugs 312 and 310. As described, an electron beam 314 applied to the polysilicon contact plugs 312 and 310 as shown in FIG. 3A, accumulates charge in the polysilicon contact plug 310 connected to the isolation region 306, due to changing voltage, illumination time or observation magnification. A dark image is observed as the number of detected second electrons decreases. In addition, connection between the polysilicon contact plug 312 and active region 304 releases electrons through the substrate 302 (as shown by the dotted line), such that a bright image is observed due to the increased second electrons and SEM reveals a different brightness contrast.

FIG. 3B illustrates the piping defect 316 formed between the polysilicon contact plugs 312 and 310 during deposition of the inter-layer dielectric layer 308. As an electron beam 314 is applied by SEM to the contact plugs 312 and 310 as shown in FIG. 3B, charge in the polysilicon contact plug 310 connected to the isolation region 306 normally accumulates by changing voltage of the electron beam, illumination time or observation magnification. However, no charge accumulates on the polysilicon contact plug 310 due to its connection to contact plug 312 from formation of the piping defect 316 during deposition of the inter-layer dielectric layer 308. Electrons from the contact plug 310 thus transfer to the piping defect 316, and discharge together with the electrons from the contact plug 312 through the semiconductor substrate 302. Since the image from SEM with a different brightness contrast cannot be observed as in FIG. 3A, a piping defect exists between the contact plugs 312 and 310.

Piping defect detection according to the invention is not limited to usage of SEM, other devices having an electron beam can also be utilized as an inspection device.

The method of piping defect detection according to the present invention is non-destructive, simple, and effective, providing complete detection, online monitoring, short inspection time, and reduced time and costs.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method of piping defect detection, comprising:
    providing a semiconductor substrate having an active region and an isolation region thereon;
        forming a plurality of semiconductor elements on the semiconductor substrate;
        depositing a dielectric layer on the semiconductor substrate and the semiconductor elements;
        forming first and second contact plugs in the dielectric layer to connect the active region and the isolation region respectively; and
        illuminating the first contact plug and the second contact plug by an electron beam, accumulating charge on the second contact plug, and determining if piping defects exist between the first contact plug and the second contact plug according to brightness contrast between the first contact plug and the second contact plug.

2. The method of claim 1, wherein brightness contrast is detected by scanning electron microscope or a defect detection device.

3. The method of claim 1, wherein the active region comprises an ion-doped region.

4. The method of claim 1, wherein the isolation region comprises a local oxidation structure or a shallow trench isolation structure.

5. The method of claim 1, wherein the semiconductor element comprises a MOS transistor.

6. The method of claim 1, wherein the first contact plug and the second contact plug are polysilicon contact plugs.

7. The method of claim 1, further comprising changing voltage of the electron beam, illumination time or observation magnification during illumination of the first and the second contact plugs by an electron beam.

8. The method of claim 1, wherein piping defects are detected when brightness contrast between the first contact plug and the second contact plug has not been observed after illuminating the first contact plug and the second contact plug by an electron beam.

* * * * *